United States Patent [19]

Monk

[11] Patent Number: 4,663,739

[45] Date of Patent: * May 5, 1987

[54] SEMICONDUCTOR MEMORIES

[75] Inventor: Trevor K. Monk, Bexley, England

[73] Assignee: STC PLC, London, England

[*] Notice: The portion of the term of this patent subsequent to Apr. 22, 2003 has been disclaimed.

[21] Appl. No.: 850,620

[22] Filed: Apr. 11, 1986

Related U.S. Application Data

[63] Continuation of Ser. No. 557,459, Dec. 2, 1983, Pat. No. 4,584,671.

[30] Foreign Application Priority Data

Dec. 3, 1982 [GB] United Kingdom ................ 8234637

[51] Int. Cl.[4] .............................................. G11C 13/00
[52] U.S. Cl. ....................................... 365/154; 365/51
[58] Field of Search ................... 365/51, 154, 189, 230

[56] References Cited

U.S. PATENT DOCUMENTS 4,420,820 12/1986 Preedy .................................. 365/189
4,584,671 4/1986 Monk .................................... 365/154

FOREIGN PATENT DOCUMENTS 0087979 9/1983 European Pat. Off. .
1299113 12/1972 United Kingdom .
2049276B 12/1980 United Kingdom .
2141871A 1/1985 United Kingdom .

Primary Examiner—Terrell W. Fears
Attorney, Agent, or Firm—Kerkam, Stowell, Kondracki & Clarke

[57] ABSTRACT

A semiconductor flip-flop memory circuit having a particular spatial format to correct an obvious error.

7 Claims, 4 Drawing Figures

SEMICONDUCTOR MEMORIES

This is a continuation of copending prior application Ser. No. 557,459 filed Dec. 2, 1983, now U.S. Pat. No. 4,584,671.

This invention relates to semiconductor memories and in particular to static random access memories.

There is a constant trend in semiconductor memory design to achieve a high degree of complexity in the minimum chip area. One development that has facilitated this increase in component density has been the introduction of polycrystalline silicon (polysilicon) as a gate material and as a second level interconnect. Whilst the use of this latter material has reduced the constraints on conductor spacings the relatively high resistivity of polycrystalline has restricted the access time of memory devices by introducing significant RC delays. Hence the use of polysilicon as an interconnect has been restricted.

A major restriction on access time is caused by the RC delay of the X-access signal along polysilicon word-lines to the cell access transistors. These lines are, therefore, made as short as possible by orientating them parallel to the short side of the memory cell array(s).

A conventional static memory cell is laid out with both power supply lines entering at one end and the cell access transistors at the other. Such a layout is necessarily asymmetric in order to facilitate the electrical cross-coupling. Orthogonal cell layouts reflect this asymmetry in the cell boundary which is not rectangular but notched at one or both ends.

If the access transistor end of the cell is notched, which is the practice with current processes, this results in the polysilicon word-line following a zig-zag or serpentine course through the memory cell array. This considerably increases the effective word-line length and results in an RC time constant that provides a severe limitation on the cell access speed.

The object of the present invention is to minimise or to overcome this disadvantage.

According to the invention there is provided a semiconductor static random access memory, including a plurality of memory cells disposed in an array of rows and columns on a semiconductor substrate, word lines one for each row of said memory cells, and bit lines one for each column of said memory cells, wherein said memory cells are of such a shape and configuration and are so disposed in the array that the word lines associated therewith are substantially straight.

We have found that the cells of a static random access memory can be fabricated with a diagonal or parallelogram configuration. This allows the cells to be tessalated in the array at a similar packing density to conventional rectangular cells but allows the word line contact to be so positioned that a straight word line may be employed. This considerably reduces the effective length, and hence the RC time constant, of the line.

Typically the memory devices are employed in computers or calculators.

An embodiment of the invention will now be described with reference to the accompanying drawings in which.

Figure 1:
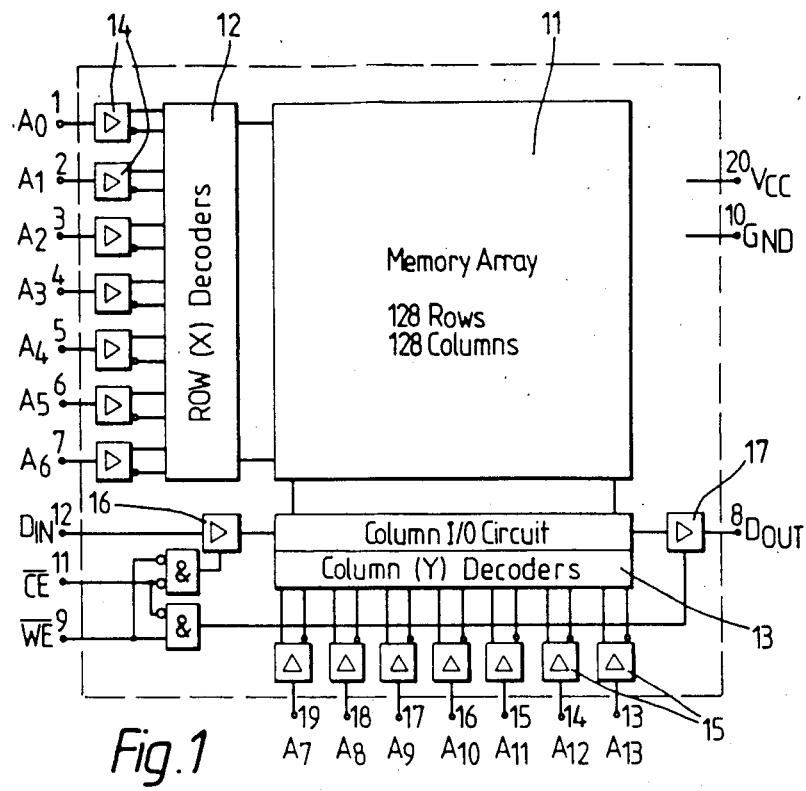
FIG. 1 is a schematic diagram of a static random access memory.

Referring to FIG. 1, the static random access memory comprises an array 11 of rows and columns of memory cells accessable via row decoders 12 and column decoders 13. In the example shown in FIG. 1 the memory has 128 by 128, i.e. $2^7$ by $2^7$ cells. Thus to access a particular cell two seven-bit binary codes corresponding to the X and Y addresses are required. These codes are input via X-address input buffers 14 and Y-address input buffers 15 to the X-decoders 12 and Y-decoders 13 respectively. Data is written into the accessed cell via the data input buffer 16 or read from the accessed cell via the data output buffer 17.

Figure 2:
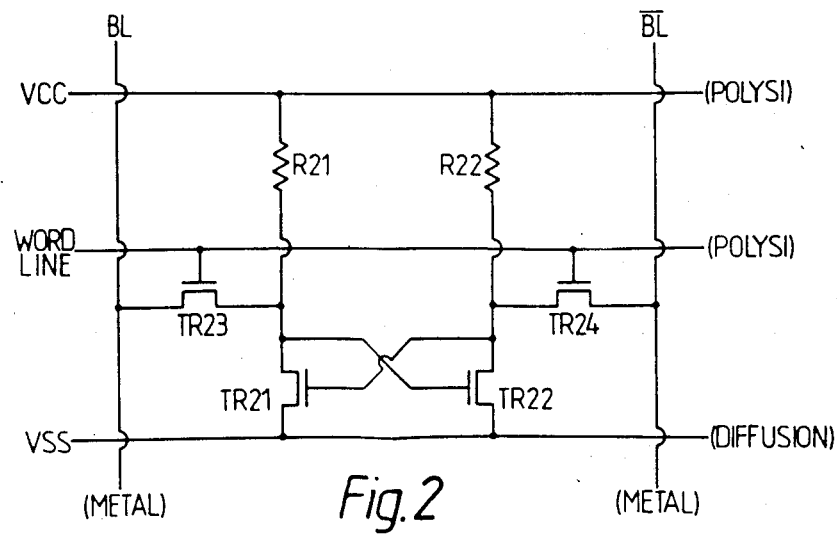
FIG. 2 shows the equivalent circuit diagram of cell of the memory of FIG. 1.

FIG. 2 shows the circuit diagram of a single memory cell. The cell comprises a pair of cross coupled NMOS field effect transistors TR21, TR22, which provide the bistable switching action of the cell. Connecting to the drains of TR21, TR22, are the cell access transistors, TR23, TR24 respectively, though which data is written into and read from the cell. These latter transistors are connected to the bit line pair, BL and $\overline{BL}$, common to all the cells of that column, and their gates are driven by a word-line, WL, common to all the cells of that row. The load resistors, R21 and R22, are implemented in this example by high resistivity polysilicon tracks.

The cell is operated from a power rail Vcc and an earth or return rail Vss. Typically the Vss rail comprises a deep diffusion running across the cell row parallel to the word lines and the Vcc rail comprises a strip of conductive material, e.g. polycrystalline silicon, also running across the cell row and disposed immediately above but insulated from the Vss diffusion. The word line WL and the bit lines BL and $\overline{BL}$ comprise respectively a polycrystalline silicon strip and a pair of metal strips. The bit lines are substantially perpendicular to the word lines.

Figure 3:
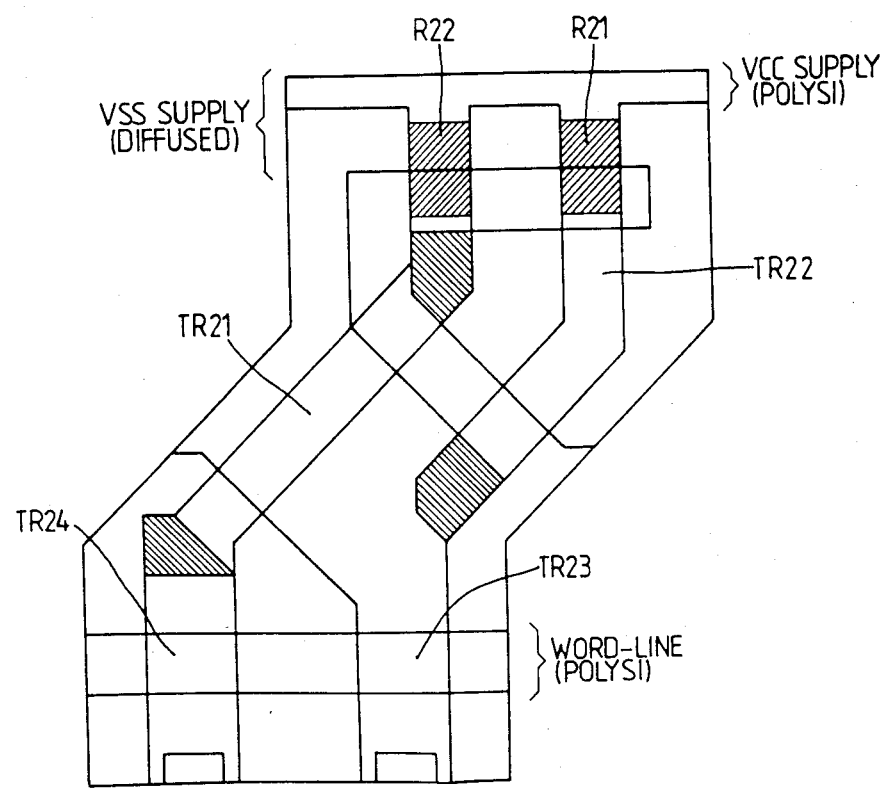
FIG. 3 shows the physical layout of the cell of FIG. 2.

The physical layout of the cell is detailed in FIG. 3. The cell is of diagonal or 'dog leg' construction whereby the gates of transistors TR23 and TR24 are aligned parallel with the direction of the cell row in which the cell is disposed. It can be seen from FIG. 3 that the layout facilitates the use of straight polysilicon word-lines. This is contrary to the conventional rectangular cell where the two input/output transistor gates are of necessity mutually offset and thus require a convoluted word line WL. The length of the present straight word line can be as little as half that of a comparable conventional convoluted word line. This effectively reduces the RC time constant of the line thus allowing a corresponding reduction in access time. It should be noted that for clarity the layout of FIG. 3 has not been drawn to scale.

Figure 4:
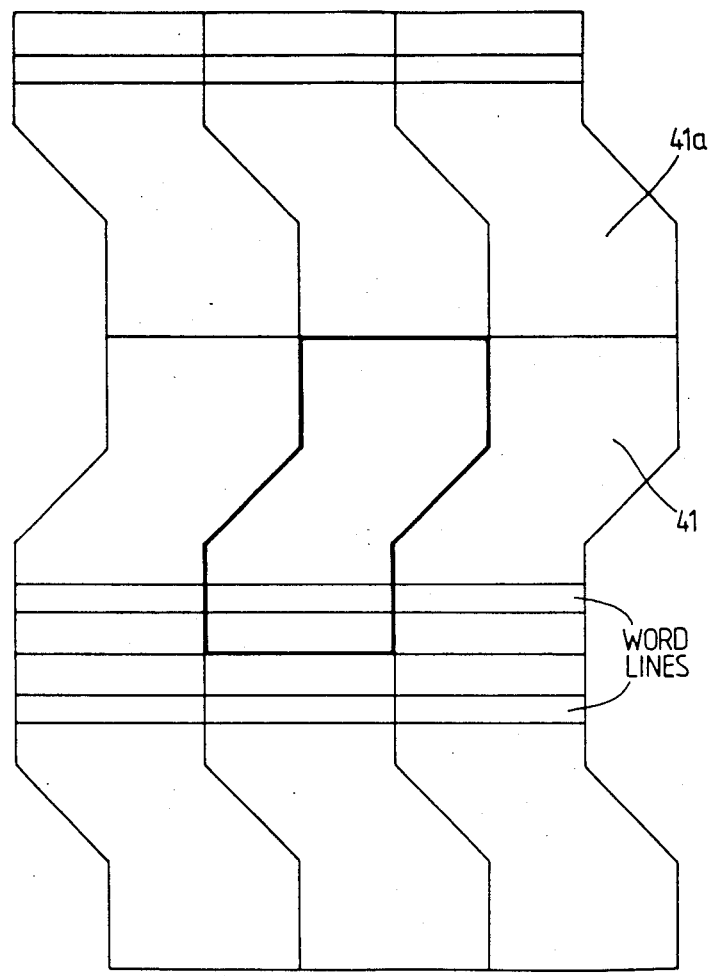
FIG. 4 illustrates the technique of tessalating the memory cells to form an array.

FIG. 4 illustrates the manner in which the cells of FIG. 3 are tessalated to form a memory array. The cells 41 are arranged in rows with the cells 41g of alternate rows inverted. Pairs of parallel word lines 42 are provided to couple to the cells of adjacent rows. The arrangement consumes no more chip space than an equivalent array of rectangular cells.

Advantageously a further reduction in word line resistance can be achieved by setting out the memory cells in two similar arrays. Each word line then has to extend only across one array portion.

Typically the memory cells described herein are fabricated by a high speed NMOS or HMOS process.

I claim:

1. A semiconductor static random access memory, including a plurality of memory cells each having first and second field effect transistors cross-coupled to form a flip-flop circuit, the cells being disposed in an array of rows on a semiconductor substrate, and word lines and bit lines whereby, in use, the cells of the array are accessed, wherein each cell comprises first and second end regions and a central region, the end regions being mutually displaced in the row direction, wherein the gate of the second transistor has a first portion perpendicular to the row direction and a second portion generally at an angle to the first portion, and wherein the gate of the first transistor is disposed generally parallel to the second portion of the gate of the second transistor.

2. A memory as claimed in claim 1 wherein the cells are disposed in rows of mirror image pairs of cells whereby the cells are tessellated on the substrate.

3. A semiconductor static random access memory, including a plurality of memory cells each having first and second field effect transistors cross-coupled to form a flip-flop circuit, the cells being disposed in an array of rows on a semiconductor substrate, and word lines and bit lines whereby, in use, the cells of the array are accessed, wherein the gate of the second transistor has a first portion transverse to the row direction and a second portion generally at an angle to the first portion, wherein the gate of the first transistor is disposed parallel to the second portion of the second transistor gate, and wherein the cell transistors are so arranged that a route is provided between adjacent rows of cells and within which route a straighter word line is accommodated than can be provided in a corresponding cell not having transistors with gates or gate portions disposed at an angle to the transverse to the row direction.

4. A memory as claimed in claim 3, wherein the word line comprises polycrystalline silicon.

5. A memory as claimed in claim 4, wherein the memory cells are disposed in two similar array portions, each said word line extending across only one said array portion.

6. In a semiconductor random access memory having an array of rows of cells each including first and second field effect storage to resistors cross coupled in a flip-flop configuration, and first and second access transistors coupled to the drains of the respective storage transistors, each cell being accessible via a pair of bit lines and a polysilicon word line, said word line being coupled to the gates of the access transistors, the improvement comprising:

a memory cell configuration wherein each said cell comprises first and second end regions disposed in a first direction generally perpendicular to the row direction and a central region disposed in a second direction generally at an angle to the perpendicular to the row direction, wherein the gate of the first storage transistor is disposed parallel to the second direction, and wherein the gate of the second storage transistor has a first portion parallel to the first direction and a second portion parallel to the second direction whereby the configuration of the cell is such as to permit at least a substantial reduction in the degree of convolution of the word line, thereby reducing the electrical resistance of the word line.

7. A memory as claimed in claim 6 wherein the cells are disposed in rows of mirror image pairs of cells whereby the cells are tessellated on the substrate.

* * * * *